United States Patent
Solgun et al.

(10) Patent No.: US 10,621,502 B2
(45) Date of Patent: Apr. 14, 2020

(54) EXTERNAL PORT MEASUREMENT OF QUBIT PORT RESPONSES

(71) Applicants: International Business Machines Corporation, Armonk, NY (US); Juelich Research Center, Jülich (DE)

(72) Inventors: Firat Solgun, Ossining, NY (US); David P. DiVincenzo, Voerendaal (NL)

(73) Assignees: INTERNATIONAL BUSINESS MACHINES CORPORATION, Armonk, NY (US); JUELICH RESEARCH CENTER, Jülich (DE)

(*) Notice: Subject to any disclaimer, the term of this patent is extended or adjusted under 35 U.S.C. 154(b) by 0 days.

(21) Appl. No.: 16/117,255

(22) Filed: Aug. 30, 2018

(65) Prior Publication Data

US 2020/0074345 A1 Mar. 5, 2020

(51) Int. Cl.
*G06N 10/00* (2019.01)
*G01R 31/317* (2006.01)
*H03K 19/195* (2006.01)

(52) U.S. Cl.
CPC ....... *G06N 10/00* (2019.01); *G01R 31/31702* (2013.01); *H03K 19/195* (2013.01)

(58) Field of Classification Search
CPC ............. H03K 19/195; H03K 19/1952; H03K 19/1956; H03K 19/1958
See application file for complete search history.

(56) References Cited

U.S. PATENT DOCUMENTS

| | | | |
|---|---|---|---|
| 8,861,619 B2 | 10/2014 | McDermott et al. | |
| 9,917,580 B2 | 3/2018 | Naaman | |
| 9,948,254 B2 | 4/2018 | Narla et al. | |
| 9,967,011 B1 | 5/2018 | Lipworth et al. | |
| 2017/0228483 A1* | 8/2017 | Rigetti | G06N 7/00 |
| 2018/0240035 A1 | 8/2018 | Scheer et al. | |
| 2019/0044051 A1* | 2/2019 | Caudillo | G06N 10/00 |

(Continued)

FOREIGN PATENT DOCUMENTS

WO 2017062143 A1 4/2017

OTHER PUBLICATIONS

Nigg et al., Black-Box Superconducting Circuit Quantization, Physical Review Letters, Jun. 15, 2012.

(Continued)

*Primary Examiner* — Seokjin Kim
(74) *Attorney, Agent, or Firm* — Amin, Turocy & Watson, LLP

(57) ABSTRACT

Systems, computer-implemented methods, and computer program products to facilitate external port measurement of qubit port responses are provided. According to an embodiment, a computer-implemented method can comprise terminating, by a system operatively coupled to a processor, one or more qubit ports with different electrical connections. The computer-implemented method can also comprise determining, by the system, one or more qubit port responses from external port responses based on the terminating. In some embodiments, the computer-implemented method can further comprise determining, by the system, a multiport admittance function corresponding to at least two of the one or more qubit ports.

24 Claims, 10 Drawing Sheets

(56) References Cited

U.S. PATENT DOCUMENTS

2019/0044668 A1* 2/2019 Elsherbini .............. G06N 10/00

OTHER PUBLICATIONS

Vesterinen, et al., Tunable Impedance Matching for Josephson Junction Reflection Amplifier, IEEE Transactions on Applied Superconductivity, Jun. 3, 2013, 5 Pages, vol. 23. No. 3.
Solgun, et al., Simple Impedance Response Formulas for the Dispersive Interaction Rates in the Effective Hamiltonians of Low Anharmonicity Superconducting Qubits, Dec. 21, 2017, 20 Pages.
Solgun, et al., Multiport Impedance Quantization, May 18, 2015, 72 Pages.
International Search Report and Written Opinion received for PCT Application Serial No. PCT/EP2019/070492 dated Nov. 7, 2019, 15 pages.
Solgun et al., "Simple Impedance Response Formulas for the Dispersive Interaction Rates in the Effective Hamiltonians of Low Anharmonicity Superconducting Qubits", IEEE Transactions on Microwave Theory and Techniques, vol. 67, No. 3, Mar. 3, 2019, pp. 928-948.
Solgun et al., "Multipart Impedance Quantization", Arxiv.org, Cornell University Library, 201 Olin Library Cornell University Ithaca, May 15, 2015, 72 pages.
Solgun, Firat, "Analysis and Synthesis of Multi-Qubit, Multi-Mode Quantum Devices", Mar. 27, 2015, 181 pages.

* cited by examiner

EXTERNAL PORT MEASUREMENT OF QUBIT PORT RESPONSES

STATEMENT REGARDING FEDERALLY SPONSORED RESEARCH OR DEVELOPMENT

This invention was made with Government support under W911NF-16-1-0114-FE awarded by Intelligence Advanced Research Projects Activity (IARPA). The Government has certain rights to this invention.

BACKGROUND

The subject disclosure relates to superconducting quantum circuits, and more specifically, to external port measurement of qubit port responses.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits that comprise superpositions of both 0 and 1, can entangle multiple quantum bits, and use interference.

Quantum computing hardware can be different from classical computing hardware. In particular, superconducting quantum circuits generally rely on Josephson junctions, which can be fabricated in a semiconductor device. A Josephson junction generally manifests the Josephson effect of a supercurrent, where current can flow indefinitely across a Josephson junction without an applied voltage. A Josephson junction can be created by weakly coupling two superconductors (a material that conducts electricity without resistance), for example, by a tunnel barrier.

One way in which a Josephson junction can be used in quantum computing is by embedding the Josephson junction in a superconducting circuit to form a quantum bit (qubit). A Josephson junction can be used to form a qubit by arranging the Josephson junction in parallel with a shunting capacitor. A plurality of such qubits can be arranged on a superconducting quantum circuit fabricated on a semiconductor device. The qubits can be arranged in a lattice (e.g., a grid) formation such that they can be coupled to nearest-neighbor qubits. Such an arrangement of qubits coupled to nearest-neighbor qubits can constitute a quantum computing architecture. An example of an existing quantum computing architecture is the quantum surface code architecture, which can further comprise microwave readout resonators coupled to the respective qubits that facilitate reading quantum information of the qubits (also referred to as addressing or reading a quantum logic state of the qubit). Such a quantum surface code architecture can be integrated on a semiconducting device to form an integrated quantum processor that can execute computations and information processing functions that are substantially more complex than can be executed by classical computing devices (e.g., general-purpose computers, special-purpose computers, etc.).

Superconducting quantum devices (e.g., a superconducting quantum chip, a quantum processor, etc.) can comprise internal ports (e.g., qubit ports) that can be defined across terminals of a qubit, for example, across terminals of a Josephson junction. As referenced herein, a qubit port can comprise an internal lumped port that can be defined across terminals of Josephson junctions. The internal ports (e.g., qubit ports) can be probed to determine information such as, for example, port response functions (e.g., impedance matrices, admittance matrices, etc.). Such information obtained from probing qubits (e.g., probing qubit ports) can be utilized, for example, to: construct Hamiltonians of a circuit quantum electrodynamic (circuit-QED) system; determine exchange coupling rates between qubits; and/or determine classical cross-talk measures corresponding to multiple qubits. As referenced herein, a Hamiltonian can comprise an operator that can correspond to the total energy of a system (e.g., a circuit-QED), where the spectrum of a Hamiltonian can comprise a set of possible outcomes that can result from measuring the total energy of the system.

A challenge associated with probing internal ports (e.g., qubit ports of qubits) is the difficulty of accessing such ports, which are internal to a superconducting quantum device (e.g., a superconducting quantum chip, a quantum processor, etc.). Another challenge associated with probing internal ports such as, for example, qubit ports, is the difficulty of physically connecting radio frequency (RF) probes to one or more terminals of a qubit (e.g., Josephson junction terminals), in a non-invasive manner, due to the small size of such terminals.

Existing superconducting quantum systems provide for constructing Hamiltonians from port response functions by defining internal ports (e.g., qubit ports) and external ports. Some prior art systems illustrate how the response of a system seen at the qubit ports is enough to construct the full Hamiltonian of the superconducting device. In such prior art systems, the port response functions (e.g., impedance matrices, admittance matrices, etc.) seen at the qubit ports are assumed to be calculated in Electromagnetic Simulation software systems. A problem associated with such prior art systems is they fail to disclose extracting internal (qubit) port responses from port response functions measured at the external ports, which can be used to obtain and/or validate Quantum Hamiltonian models of a superconducting qubit circuit.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that facilitate external port measurement of qubit port responses are described.

According to an embodiment, a computer-implemented method can comprise terminating, by a system operatively coupled to a processor, one or more qubit ports with different electrical connections. The computer-implemented method can also comprise determining, by the system, one or more qubit port responses from external port responses based on the terminating. An advantage of such a computer-implemented method is that it can be employed to probe qubits internal to a superconducting quantum device (e.g., a superconducting quantum chip, a quantum processor, etc.) using external ports (e.g., ports that are external to such superconducting quantum device), rather than directly accessing qubit ports of the qubits to facilitate such probing.

In some embodiments, the computer-implemented method can further comprise determining, by the system, a multiport admittance function corresponding to at least two of the one or more qubit ports. An advantage of such a computer-implemented method is that it can be employed to determine a multiport admittance function corresponding to an indefinite quantity of qubit ports of an indefinite quantity of qubits internal to a superconducting quantum device (e.g., a superconducting quantum chip, a quantum processor, etc.), thereby enabling scalability of a qubit probing system that can be implemented to externally probe such indefinite quantity of qubits internal to such superconducting quantum device.

According to another embodiment, a system can comprise a memory that stores computer executable components and a processor that executes the computer executable components stored in the memory. The computer executable components can comprise a termination component that can terminate one or more qubit ports with different electrical connections. The computer executable components can further comprise a calculation component that can determine one or more qubit port responses from external port responses based on one or more terminated qubit ports. An advantage of such a system is that it can be employed to probe qubits internal to a superconducting quantum device (e.g., a superconducting quantum chip, a quantum processor, etc.) using external ports (e.g., ports that are external to such superconducting quantum device), rather than directly accessing qubit ports of the qubits to facilitate such probing.

In some embodiments, the calculation component can further determine at least one of an admittance function or an impedance function of the one or more qubit ports. An advantage of such a system is that it can be employed to determine a multiport admittance function corresponding to an indefinite quantity of qubit ports of an indefinite quantity of qubits internal to a superconducting quantum device (e.g., a superconducting quantum chip, a quantum processor, etc.), thereby enabling scalability of a qubit probing system that can be implemented to externally probe such indefinite quantity of qubits internal to such superconducting quantum device.

According to another embodiment, a computer-implemented method can comprise determining, by a system operatively coupled to a processor, one or more external port responses based on one or more electrically terminated qubit ports. The computer-implemented method can further comprise determining, by the system, one or more qubit port responses based on the one or more external port responses. An advantage of such a computer-implemented method is that it can be employed to probe qubits internal to a superconducting quantum device (e.g., a superconducting quantum chip, a quantum processor, etc.) using external ports (e.g., ports that are external to such superconducting quantum device), rather than directly accessing qubit ports of the qubits to facilitate such probing.

In some embodiments, the computer-implemented method can further comprise determining, by the system, a multiport admittance function corresponding to at least two qubit ports. An advantage of such a computer-implemented method is that it can be employed to determine a multiport admittance function corresponding to an indefinite quantity of qubit ports of an indefinite quantity of qubits internal to a superconducting quantum device (e.g., a superconducting quantum chip, a quantum processor, etc.), thereby enabling scalability of a qubit probing system that can be implemented to externally probe such indefinite quantity of qubits internal to such superconducting quantum device.

According to another embodiment, a computer program product that can facilitate an external port measurement of qubit port responses process. The computer program product can comprise a computer readable storage medium having program instructions embodied therewith, the program instructions can be executable by a processor to cause the processor to determine, by the processor, one or more external port responses based on one or more electrically terminated qubit ports. The program instructions can be further executable to cause the processor to determine, by the processor, one or more qubit port responses based on the one or more external port responses. An advantage of such a computer program product is that it can be employed to probe qubits internal to a superconducting quantum device (e.g., a superconducting quantum chip, a quantum processor, etc.) using external ports (e.g., ports that are external to such superconducting quantum device), rather than directly accessing qubit ports of the qubits to facilitate such probing.

In some embodiments, the program instructions can also be executable to cause the processor to determine, by the processor, a multiport admittance function corresponding to at least two qubit ports. An advantage of such a computer program product is that it can be employed to determine a multiport admittance function corresponding to an indefinite quantity of qubit ports of an indefinite quantity of qubits internal to a superconducting quantum device (e.g., a superconducting quantum chip, a quantum processor, etc.), thereby enabling scalability of a qubit probing system that can be implemented to externally probe such indefinite quantity of qubits internal to such superconducting quantum device.

According to another embodiment, a computer-implemented method can comprise terminating, by a system operatively coupled to a processor, one or more qubit ports with different electrical connections. The computer-implemented method can further comprise determining, by the system, a relationship between external port responses and qubit port responses based on the terminating. An advantage of such a computer-implemented method is that it can be employed to probe qubits internal to a superconducting quantum device (e.g., a superconducting quantum chip, a quantum processor, etc.) using external ports (e.g., ports that are external to such superconducting quantum device), rather than directly accessing qubit ports of the qubits to facilitate such probing.

In some embodiments, the computer-implemented method can further comprise determining, by the system, a multiport admittance function corresponding to at least two of the one or more qubit ports. An advantage of such a computer-implemented method is that it can be employed to determine a multiport admittance function corresponding to an indefinite quantity of qubit ports of an indefinite quantity of qubits internal to a superconducting quantum device (e.g., a superconducting quantum chip, a quantum processor, etc.), thereby enabling scalability of a qubit probing system that can be implemented to externally probe such indefinite quantity of qubits internal to such superconducting quantum device.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given the above problem with existing qubit probing systems having to directly access qubits internal to a superconducting quantum device to probe such qubits, the present disclosure can be implemented to produce a solution to this problem in the form accessing ports external to such a superconducting quantum device to probe qubits internal to such device. An advantage of the present disclosure described herein is that it can be employed to probe qubits internal to a superconducting quantum device (e.g., a superconducting quantum chip, a quantum processor, etc.) using external ports (e.g., ports that are external to such superconducting quantum device), rather than directly accessing qubit ports of the qubits to facilitate such probing. Another advantage of the present disclosure is that it can be employed to determine a multiport admittance function corresponding to an indefinite quantity of qubit ports of an indefinite quantity of qubits internal to a superconducting quantum device (e.g., a superconducting quantum chip, a quantum processor), thereby enabling scalability of a qubit probing system that can be implemented to externally probe such indefinite quantity of qubits internal to such superconducting quantum device.

Figure 1:
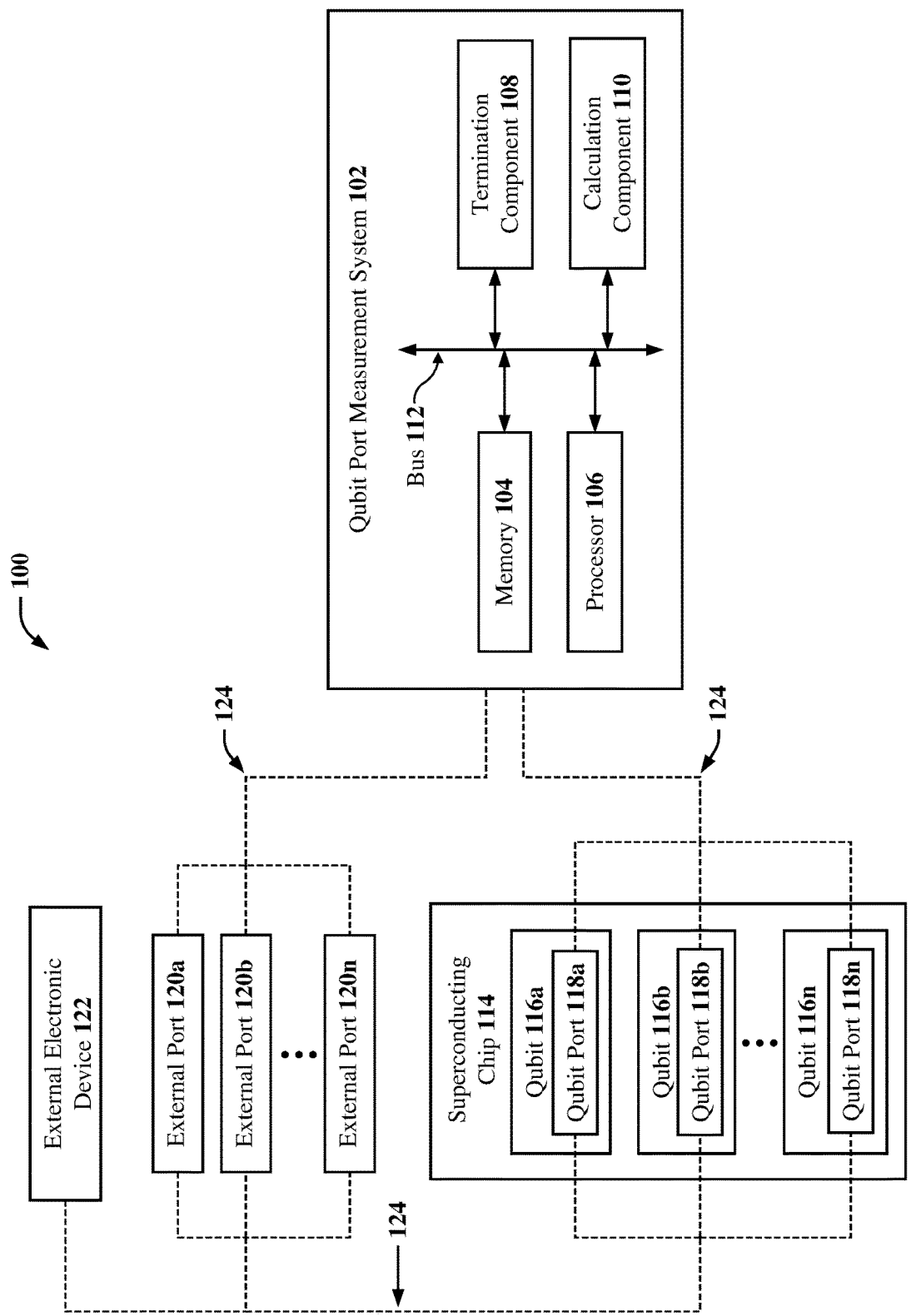
FIG. 1 illustrates a block diagram of an example, non-limiting system that facilitates external port measurement of qubit port response components in accordance with one or more embodiments described herein.

FIG. 1 illustrates a block diagram of an example, non-limiting system 100 that facilitates external port measurement of qubit port response components in accordance with one or more embodiments described herein. According to several embodiments, system 100 can comprise a qubit port measurement system 102, one or more superconducting chips 114, one or more external ports 120a, 120b, 120n (where "n" can represent a total respective quantity of external ports), and/or an external electronic device 122. In some embodiments, qubit port measurement system 102 can comprise a memory 104, a processor 106, a termination component 108, a calculation component 110, and/or a bus 112. In some embodiments, superconducting chip 114 can comprise one or more qubits 116a, 116b, 116n that can respectively comprise one or more qubit ports 118a, 118b, 118n, where "n" can represent a total respective quantity of such components.

In some embodiments, various components of system 100 can be communicatively, electrically, and/or operatively coupled via a linear passive microwave structure 124. For example, qubit port measurement system 102, superconducting chip 114, qubits 116a, 116b, 116n, qubit ports 118a, 118b, 118n, external ports 120a, 120b, 120n, and/or external electronic device 122 can be communicatively, electrically, and/or operatively coupled via linear passive microwave structure 124. In some embodiments, linear passive microwave structure 124 can comprise a linear passive microwave structure that can facilitate transmission of microwave frequency signals. For example, linear passive microwave structure can comprise a coaxial line (e.g., a 50 Ohm line), a transmission line, a bus (e.g., a resonant bus), a waveguide, a microwave resonator, and/or another linear passive microwave structure.

It should be appreciated that the embodiments of the subject disclosure depicted in various figures disclosed herein are for illustration only, and as such, the architecture of such embodiments are not limited to the systems, devices, and/or components depicted therein. For example, in some embodiments, system 100, qubit port measurement system 102, superconducting chip 114, and/or external electronic device 122, can further comprise various computer and/or computing-based elements described herein with reference to operating environment 1000 and FIG. 10. In several embodiments, such computer and/or computing-based elements can be used in connection with implementing one or more of the systems, devices, components, and/or computer-implemented operations shown and described in connection with FIG. 1 or other figures disclosed herein.

Although the subject disclosure is described herein with reference to qubits and qubit ports (internal ports), it should be appreciated that the embodiments of the subject disclosure are not so limited (e.g., not limited to qubits). For example, the subject disclosure (e.g., system 100, qubit port measurement system 102, etc.) can be employed to extract responses of various other systems (e.g., not superconducting quantum systems, superconducting qubit circuits, etc.) seen at some other type(s) of internal lumped ports defined across terminals of interest (e.g., internal lumped ports internal to the system and not directly accessible) such that responses seen at these internal ports can be determined without probing them directly but by doing only external measurements (at the ports accessible to the measurement electronics).

According to multiple embodiments, memory 104 can store one or more computer and/or machine readable, writable, and/or executable components and/or instructions that, when executed by processor 106, can facilitate performance of operations defined by the executable component(s) and/or instruction(s). For example, memory 104 can store computer and/or machine readable, writable, and/or executable components and/or instructions that, when executed by processor 106, can facilitate execution of the various functions described herein relating to qubit port measurement system 102, termination component 108, calculation component 110, superconducting chip 114, qubits 116a, 116b, 116n, qubit ports 118a, 118b, 118n, external ports 120a, 120b, 120n, and/or external electronic device 122.

In some embodiments, memory 104 can comprise volatile memory (e.g., random access memory (RAM), static RAM (SRAM), dynamic RAM (DRAM), etc.) and/or non-volatile memory (e.g., read only memory (ROM), programmable ROM (PROM), electrically programmable ROM (EPROM), electrically erasable programmable ROM (EEPROM), etc.) that can employ one or more memory architectures. Further examples of memory 104 are described below with reference to system memory 1016 and FIG. 10. Such examples of memory 104 can be employed to implement any embodiments of the subject disclosure.

According to multiple embodiments, processor 106 can comprise one or more types of processors and/or electronic circuitry that can implement one or more computer and/or machine readable, writable, and/or executable components and/or instructions that can be stored on memory 104. For example, processor 106 can perform various operations that can be specified by such computer and/or machine readable, writable, and/or executable components and/or instructions including, but not limited to, logic, control, input/output (I/O), arithmetic, and/or the like. In some embodiments, processor 106 can comprise one or more central processing unit, multi-core processor, microprocessor, dual microprocessors, microcontroller, System on a Chip (SOC), array processor, vector processor, and/or another type of processor.

According to several embodiments, qubit port measurement system 102, memory 104, processor 106, termination component 108, and/or calculation component 110 can be communicatively, electrically, and/or operatively coupled to one another via a bus 112 to perform functions of system 100, qubit port measurement system 102, and/or any components coupled therewith. In several embodiments, bus 112 can comprise one or more memory bus, memory controller, peripheral bus, external bus, local bus, and/or another type of bus that can employ various bus architectures. Further examples of bus 112 are described below with reference to system bus 1018 and FIG. 10. Such examples of bus 112 can be employed to implement any embodiments of the subject disclosure.

In some embodiments, qubit port measurement system 102 can comprise one or more computer and/or machine readable, writable, and/or executable components and/or instructions that, when executed by processor 106, can facilitate performance of operations defined by such component(s) and/or instruction(s). Further, in numerous embodiments, any component associated with qubit port measurement system 102, as described herein with or without reference to the various figures of the subject disclosure, can comprise one or more computer and/or machine readable, writable, and/or executable components and/or instructions that, when executed by processor 106, can facilitate performance of operations defined by such component(s) and/or instruction(s). For example, termination component 108, calculation component 110, and/or any other components associated with qubit port measurement system 102 as disclosed herein (e.g., communicatively, electronically, and/or operatively coupled with and/or employed by qubit port measurement system 102), can comprise such computer and/or machine readable, writable, and/or executable component(s) and/or instruction(s). Consequently, according to numerous embodiments, qubit port measurement system 102 and/or any components associated therewith as disclosed herein, can employ processor 106 to execute such computer and/or machine readable, writable, and/or executable component(s) and/or instruction(s) to facilitate performance of one or more operations described herein with reference to qubit port measurement system 102 and/or any such components associated therewith.

In some embodiments, qubit port measurement system 102, superconducting chip 114, and/or external electronic device 122 can comprise any type of component, machine, device, facility, apparatus, and/or instrument that can comprise a processor and/or can be capable of effective and/or operative communication with a wired and/or wireless network. All such embodiments are envisioned. For example, qubit port measurement system 102, superconducting chip 114, and/or external electronic device 122 can comprise a server device, a computing device, a general-purpose computer, a special-purpose computer, a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

According to multiple embodiments, superconducting chip 114 can comprise a superconducting quantum chip. For example, superconducting chip 114 can comprise one or more superconducting quantum bit circuits (qubit circuits) fabricated on a semiconductor device (e.g., a silicon substrate). In some embodiments, superconducting chip 114 can comprise one or more superconducting qubit circuits that can couple qubits 116a, 116b, 116n. For example, superconducting chip 114 can comprise one or more superconducting qubit circuits comprising qubits 116a, 116b, 116n coupled (e.g., communicatively, electrically, operatively, etc.) to one another via linear passive microwave structure 124. For instance, linear passive microwave structure 124 can couple qubit ports 118a, 118b, 118n to one another. In some embodiments, superconducting chip 114, and/or components thereof, can be coupled to a printed circuit board (not illustrated in FIG. 1). For example, linear passive microwave structure 124 can couple (e.g., communicatively, electrically, operatively, etc.) superconducting chip 114, qubits 116a, 116b, 116n, and/or qubit ports 118a, 118b, 118n to a printed circuit board.

According to several embodiments, qubit 116a, 116b, 116n can comprise various types of quantum bits (qubits). For instance, qubit 116a, 116b, 116n can comprise a qubit including, but not limited to, a transmon qubit, charge qubit, flux qubit, phase qubit, and/or another type of qubit where lumped ports (qubit ports) can be defined across terminals of Josephson junctions used in the design of the qubit. In some embodiments, qubit 116a, 116b, 116n can comprise a qubit having one or more Josephson junctions. For example, qubit 116a, 116b, 116n can comprise a transmon qubit having a single Josephson junction. In another example, qubit 116a, 116b, 116n can comprise a transmon qubit having multiple Josephson junctions such as, for example, a transmon qubit having a Superconducting Quantum Interference Device (SQUID) loop consisting of two Josephson junctions and the qubit frequency can be tuned by applying a flux bias in the SQUID loop. In another example, qubit 116a, 116b, 116n can comprise a Capacitively Shunted Flux Qubit (CSFQ).

As referenced herein, a Josephson junction can comprise a superconducting component that manifest the Josephson effect of a supercurrent, where current can flow indefinitely across a Josephson junction without an applied voltage. For example, a Josephson junction can be created by weakly coupling (e.g., communicatively, electrically, operatively, etc.) two superconductors (e.g., capacitive pads) using a tunnel barrier (or tunnel layer) that can comprise a non-superconducting, non-conductive material such as, for example, aluminum oxide ($Al_2O_3$).

According to multiple embodiments, qubit port 118a, 118b, 118n can comprise an internal port of superconducting chip 114 that can be defined across terminals of a qubit. For example, qubit port 118a, 118b, 118n can comprise an internal port of superconducting chip 114 that can be defined across respective terminals of qubits 116a, 116b, 116n. For instance, qubit port 118a, 118b, 118n can comprise an internal port that can be defined across terminals of a Josephson junction of a transmon qubit (e.g., qubit 116a, 116b, 116n). In some embodiments, qubit ports 118a, 118b, 118n can exist without a Josephson junction, for example, in embodiments having no junctions connected (e.g., in simulated embodiments of the subject disclosure, mathematical concept embodiments, etc.).

In some embodiments, various information can be present at one or more qubit ports. For example, microwave response functions (port response functions) can be present at one or more qubit ports 118a, 118b, 118n. In some embodiments, such information can be utilized to determine other information corresponding to a circuit quantum electrodynamic (circuit-QED) system. For example, information present at one or more qubit ports 118a, 118b, 118n can be utilized to construct the Hamiltonian of a circuit-QED system. In another example, such information can be utilized to determine exchange coupling rates between qubits (e.g., qubits 116a, 116b, 116n) and/or classical cross-talk measures corresponding to one or more qubits (e.g., qubits 116a, 116b, 116n).

It should be appreciated that obtaining information present at one or more qubit ports can be difficult. For example, directly measuring microwave response functions at a qubit port (e.g., qubit port 118a, 118b, 118n) by directly (physically) accessing such a qubit port can be difficult due to the challenge of connecting radio frequency (RF) probes to a Josephson junction of a qubit in a non-invasive manner. However, in some embodiments described below, an advantage of the subject disclosure is that qubit port measurement system 102 can extract information present at one or more qubit ports 118a, 118b, 118n by accessing one or more external ports 120a, 120b, 120n.

According to several embodiments, external port 120a, 120b, 120n can comprise an external port that can be defined on a signal carrying line, such as, for example, linear passive microwave structure 124. For instance, external port 120a, 120b, 120n can comprise an external port that can be defined on a cross-section of linear passive microwave structure 124. For example, external port 120a, 120b, 120n can be defined on a cross-section of a 50 Ohm line that can transmit microwave frequency signals (microwave signals) to and from superconducting chip 114, qubits 116a, 116b, 116n, and/or qubit ports 118a, 118b, 118n.

According to multiple embodiments, external electronic device 122 can comprise any external electronic device that can transmit microwave signals at a single frequency (single tone) and receive reflected microwave signals at a single frequency. For example, external electronic device 122 can comprise a vector network analyzer (VNA) that can transmit microwave signals at a single frequency to superconducting chip 114, qubits 116a, 116b, 116n, and/or qubit ports 118a, 118b, 118n (e.g., via linear passive microwave structure 124) and can receive microwave signals at a single frequency reflected by such components. In this example, such transmission of microwave signals at a single frequency can constitute probing qubits 116a, 116b, 116n.

In some embodiments, qubit port measurement system 102 can extract qubit responses of one or more qubits in a superconducting qubit circuit. For example, qubit port measurement system 102 can extract qubit responses (also referred to herein as qubit response functions) of one or more qubits 116a, 116b, 116n in a superconducting qubit circuit on superconducting chip 114, where such qubit responses can be present at one or more qubit ports (e.g., qubit ports 118a, 118b, 118n) of such qubits. For instance, qubit port measurement system 102 can extract microwave port responses (qubit responses or qubit response functions) including, but not limited to, admittance functions (matrices), multiport admittance functions (matrices), impedance functions (matrices), and/or another microwave port response.

In some embodiments, to facilitate extraction of qubit responses (qubit response functions), qubit port measurement system 102 can employ one or more linear functions (equations) represented by one or more matrix equations. For example, qubit port measurement system 102 can employ one or more linear functions represented by matrix equations that can represent a relationship (e.g., a linear relationship) between external port responses obtained at one or more external ports 120a, 120b, 120n and qubit port responses present at one or more qubit ports 118a, 118b, 118n. For instance, qubit port measurement system 102 can employ equations (1) to (16) illustrated and described below to determine such relationship (e.g., a linear relationship) between external port responses and qubit port responses. In some embodiments, qubit port measurement system 102 can employ equations (1) to (16) to determine all parameters (elements, entries) of the admittance matrix (Y) in equation (2) illustrated and described below. For example, qubit port measurement system 102 can employ equations (1) to (16) to determine diagonal qubit port elements (e.g., $Y_{J1}$ and $Y_{J2}$), as well as off-diagonal qubit port elements (e.g., $Y_{J1,J2}$, $Y_{1,J1}$, $Y_{1,J2}$, $Y_{2,J1}$, $Y_{2,J2}$, etc.), which can represent the connection (e.g., relationship) between qubit ports (e.g., qubit ports 118a, 118b, 118n) and external ports (e.g., external ports 120a, 120b, 120n).

In some embodiments, qubit port measurement system 102 can perform a series of operations (described briefly here and in detail below) to facilitate extraction of qubit responses (qubit response functions) of one or more qubits of a circuit-QED system based on external port responses determined at one or more external ports of such system. In some embodiments, qubit port measurement system 102 can terminate one or more qubit ports (e.g., qubit ports 118a, 118b, 118n) using one or more types of electrical connections and/or combinations thereof (e.g., open circuit, short circuit, shunt, etc.). In some embodiments, based on termination of such qubit ports, qubit port measurement system 102 can measure microwave frequency signals at one or more external ports (e.g, external ports 120a, 120b, 120n). In some embodiments, based on such measurements, qubit port measurement system 102 can determine external port response functions (e.g., matrices and/or elements of such matrices). In some embodiments, based on such external port response functions, qubit port measurement system 102 can determine a relationship (e.g., a linear relationship) between such external port response functions and qubit port response functions by performing various mathematical operations described below with reference to equations (1) to (16) to solve for all parameters (elements, entries) of the admittance matrix (Y) in equation (2) such as, for example, diagonal qubit port elements (e.g., $Y_{J1}$ and $Y_{J2}$) and off-diagonal qubit port elements (e.g, $Y_{J1,J2}$, $Y_{1,J1}$, $Y_{1,J2}$, $Y_{2,J1}$, $Y_{2,J2}$, etc.). In some embodiments, determining the relationship between such external port response functions and qubit port response functions can enable qubit port measurement system 102 to determine such qubit port response functions by accessing only external ports of the system (as opposed to accessing qubit ports).

In some embodiments, qubit port measurement system 102 can perform the operations described briefly above (and in detail below) until all parameters (elements, entries) of the admittance matrix (Y) in equation (2) are known. For instance, qubit port measurement system 102 can perform operations including, but not limited to: terminating one or more qubit ports (qubit ports 118a, 118b, 118n) using open circuit(s), short circuit(s), shunt(s), and/or combinations thereof; measuring microwave signals at external ports (external ports 120a, 120b, 120n); determining external port response functions (e.g., external impedance and/or admittance functions, etc.); and/or employing equations (1) to (16) and various mathematical operations to determine all parameters (elements, entries) of the admittance matrix (Y) in equation (2).

In some embodiments, to facilitate extraction of qubit responses (qubit response functions), qubit port measurement system 102 can access one or more external ports of a circuit-QED system to determine external port responses (external port response functions) that can be utilized to extract qubit port response functions at one or more qubit ports in a superconducting qubit circuit. For example, to facilitate such extraction of qubit response functions, qubit port measurement system 102 can access (e.g., via linear passive microwave structure 124) one or more external ports 120a, 120b, 120n to determine external port response functions that can be utilized to extract qubit port response functions that can be present at one or more qubit ports 118a, 118b, 118n.

In some embodiments, to facilitate determining external port responses (external port response functions) at one or more external ports 120a, 120b, 120n, qubit port measurement system 102 can measure microwave frequency signals at such one or more external ports 120a, 120b, 120n. For instance, external electronic device 122 can transmit microwave signals (e.g., single frequency signals) to one or more qubits 116a, 116b, 116n and/or qubit ports 118a, 118b, 118n and qubit port measurement system 102 can measure, at one or more external ports 120a, 120b, 120n, microwave signals reflected by such components. In some embodiments, qubit port measurement system 102 can measure microwave signals at one or more external ports 120a, 120b, 120n to determine one or more microwave response functions (external port response functions) including, but not limited to, scattering response functions (matrices), admittance functions (matrices), impedance functions (matrices), and/or another response function. In some embodiments, qubit port measurement system 102 can convert one or more microwave response functions determined at external ports 120a, 120b, 120n. For example, qubit port measurement system 102 can convert a scattering matrix to an admittance matrix and/or an impedance matrix.

In some embodiments, qubit port measurement system 102 can determine one or more external admittance functions (matrices) and/or one or more external impedance functions (matrices) at one or more external ports of a circuit-QED system based on external port responses (external port response functions) measured at such external ports. For example, qubit port measurement system 102 can determine one or more external admittance functions (matrices) and/or one or more impedance functions (matrices) at one or more external ports 120a, 120b, 120n, based on external port responses measured at such external ports, by employing termination component 108 and/or calculation component 110 as described below.

In some embodiments, calculation component 110 can determine one or more external admittance functions (matrices) at one or more external ports based on external port responses (external port response functions) measured by qubit port measurement system 102 at such external port(s). In some embodiments, to facilitate determining an external admittance matrix at an external port, qubit port measurement system 102 can employ calculation component 110 to determine an admittance relation of two external ports and two internal ports (qubit ports). For example, calculation component 110 can determine such an admittance relation by utilizing equations (1) and (2) illustrated below.

$$I = YV \qquad (1)$$

$$\begin{pmatrix} I_1 \\ I_2 \\ I_{J_1} \\ I_{J_2} \end{pmatrix} = \begin{pmatrix} Y_{11} & Y_{12} & Y_{1,J_1} & Y_{2,J_2} \\ Y_{21} & Y_{22} & Y_{2,J_1} & Y_{2,J_2} \\ Y_{J_1,1} & Y_{J_1,2} & Y_{J_1} & Y_{J_1,J_2} \\ Y_{J_2,1} & Y_{J_2,2} & Y_{J_2,J_1} & Y_{J_2} \end{pmatrix} \begin{pmatrix} V_1 \\ V_2 \\ V_{J_1} \\ V_{J_2} \end{pmatrix} \qquad (2)$$

In some embodiments, equation (1) can comprise terms such as, for example, current (I), admittance (Y), and/or voltage (V). In some embodiments, equation (2) can comprise elements (parameters, entries) corresponding to two external ports, designated external port 1 and external port 2. For example, such elements can include, but are not limited to, $I_1$, $I_2$, $Y_{11}$, $Y_{12}$, $Y_{21}$, $Y_{22}$, $V_1$, $V_2$, and/or another element. In some embodiments, equation (2) can comprise elements (parameters, entries) corresponding to two internal (qubit) ports, designated $J_1$ and $J_2$. For example, such elements can include, but are not limited to, $I_{J1}$, $I_{J2}$, $Y_{J1}$, $Y_{J2}$, $Y_{J1,J2}$, $Y_{J2,J1}$, $V_{J1}$, $V_{J2}$, and/or another element. In some embodiments, the external ports 1 and 2 of equation (2) can represent two external ports of external ports 120a, 120b, 120n. In some embodiments, the qubit ports $J_1$ and $J_2$ of equation (2) can represent two qubit ports of qubit ports 118a, 118b, 118n. In some embodiments, the admittance relation system defined by equation (1) and (2) can be reciprocal such that: $Y^T = Y$.

According to multiple embodiments, qubit port measurement system 102 can employ termination component 108 to terminate one or more qubit ports with different electrical connections (e.g., to terminate such qubit ports by utilizing one or more different electrical connections). For example, qubit port measurement system 102 can employ termination component 108 to terminate (e.g., via linear passive microwave structure 124) one or more qubit ports (e.g., qubit ports $J_1$ and/or $J_2$ of qubit ports 118a, 118b, 118n) by utilizing electrical connections including, but not limited to, an open circuit electrical connection, a short circuit electrical connection, a shunt electrical connection, and/or another electrical connection or combinations thereof.

According to several embodiments, qubit port measurement system 102 can employ calculation component 110 to determine one or more qubit port responses from external port responses based on one or more terminated qubit ports. For example, qubit port measurement system 102 can employ termination component 108 to terminate one or more qubit ports (e.g., qubit ports $J_1$ and/or $J_2$ of qubit ports 118a, 118b, 118n) by utilizing electrical connections (e.g., as described above). In this example, based on such terminated qubit ports, qubit port measurement system 102 can further employ calculation component 110 to determine one or more qubit port responses (e.g., admittance functions, multiport admittance functions, impedance functions, etc.) from external port responses (e.g., from microwave response functions such as, for instance, external admittance functions determined by qubit port measurement system 102 at external ports 120a, 120b, 120n).

In some embodiments, to facilitate determining an external admittance matrix $Y_X$, qubit port measurement system 102 can employ termination component 108 to terminate one or more qubit ports by utilizing one or more different electrical connections. For example, to facilitate determining an external admittance matrix $Y_X$ (submatrix of equation (2)) qubit port measurement system 102 can employ termination component 108 to short circuit (e.g., via linear passive microwave structure 124) qubit ports $J_1$ and $J_2$ (e.g., two qubit ports of qubit ports 118a, 118b, 118n) such that:

$$\begin{pmatrix} V_{J_1} \\ V_{J_2} \end{pmatrix} = 0$$

In some embodiments, based on termination of qubit ports $J_1$ and $J_2$ by termination component 108 via short circuit electrical connections (as described above), qubit port measurement system 102 can measure microwave response functions (port response functions) at external ports 1 and 2 (e.g., two external ports of external ports 120a, 120b, 120n) to obtain a portion of the impedance corresponding to such external ports 1 and 2. For example, based on such termination of qubit ports $J_1$ and $J_2$ by termination component 108 (via short circuit electrical connections), qubit port measurement system 102 can measure microwave response functions at external ports 1 and 2 to obtain submatrix:

$$Y_X = \begin{pmatrix} Y_{11} & Y_{12} \\ Y_{21} & Y_{22} \end{pmatrix}$$

In some embodiments, qubit port measurement system 102 can determine internal diagonal elements $Y_{J_1}$ and $Y_{J_2}$ of equation (2) above. The description below discloses a non-limiting example process that can be implemented by qubit port measurement system 102 to determine internal diagonal element $Y_{J_1}$ of equation (2), however, in some embodiments, qubit port measurement system 102 can implement the same process to determine internal diagonal element $Y_{J_2}$ of equation (2).

In some embodiments, to facilitate determining internal diagonal element $Y_{J_1}$ of equation (2) above, qubit port measurement system 102 can employ termination component 108 to terminate qubit port $J_2$ with a short circuit electrical connection such that: $V_{J_2}=0$. In some embodiments, to facilitate determining internal diagonal element $Y_{J_1}$ of equation (2) above, qubit port measurement system 102 can further employ termination component 108 to terminate qubit port $J_1$ with an open circuit electrical connection such that the $3^{rd}$ line of equation (2) can become: $Y_{J_1,1}V_1+Y_{J_1,2}V_2+Y_{J_1}V_{J_1}=0$. In some embodiments, based on such termination of qubit ports $J_2$ and $J_1$ (with a short circuit and an open circuit, respectively), qubit port measurement system 102 can measure admittance at external ports 1 and 2. In such embodiments, qubit port measurement system 102 can further employ calculation component 110 to solve the equation above $(Y_{J_1,1}V_1+Y_{J_1,2}V_2+Y_{J_1}V_{J_1}=0)$ for $V_{J_1}$ and plug such solution into the $1^{st}$ and $2^{nd}$ lines of equation (2) to obtain the following admittance matrix equation (4):

$$\begin{pmatrix} Y_{11} - \frac{Y_{1,J_1}Y_{J_1,1}}{Y_{J_1}} & Y_{12} - \frac{Y_{1,J_1}Y_{J_1,2}}{Y_{J_1}} \\ Y_{21} - \frac{Y_{2,J_1}Y_{J_1,1}}{Y_{J_1}} & Y_{22} - \frac{Y_{2,J_1}Y_{J_1,2}}{Y_{J_1}} \end{pmatrix} \quad (4)$$

In some embodiments, based on $Y_X$ above, calculation component 110 can determine the quantities:

$$\frac{Y_{1,J_1}Y_{J_1,1}}{Y_{J_1}}, \frac{Y_{1,J_1}Y_{J_1,2}}{Y_{J_1}}, \frac{Y_{2,J_1}Y_{J_1,1}}{Y_{J_1}} \text{ and } \frac{Y_{2,J_1}Y_{J_1,2}}{Y_{J_1}}$$

In some embodiments, based on such quantities and utilizing reciprocity, calculation component 110 can define: $x=Y_{1,J_1}=Y_{J_1,1}$; $y=Y_{2,J_1}=Y_{J_1,2}$; and $z=Y_{J_1}$ to write the following equations (5), (6), and (7) for some complex numbers $c_1$, $c_2$, and $c_3$, respectively.

$$\frac{x^2}{z} = c_1 \quad (5)$$

$$\frac{xy}{z} = c_2 \quad (6)$$

$$\frac{y^2}{z} = c_3 \quad (7)$$

In some embodiments, such complex numbers $c_1$, $c_2$, and $c_3$ of equations (5), (6), and (7) do not provide enough information to enable calculation component 110 to solve for z. Therefore, in some embodiments, qubit port measurement system 102 can employ termination component 108 to terminate qubit port $J_2$ with a short circuit electrical connection and terminate qubit port $J_1$ with a shunt. For example, termination component 108 can terminate qubit port $J_1$ with a shunt including, but not limited to, an inductor, a finite inductor, a finite linear inductor, a diode, an electrical resistor, and/or another shunt. In some embodiments, based on such termination of qubit ports $J_2$ and $J_1$ (with a short circuit and a shunt, respectively), qubit port measurement system 102 can measure external ports 1 and 2 to obtain the following equations (8), (9), and (10) for complex numbers $c_4$, $c_5$, and $c_6$, respectively, where "L" represents an inductor (e.g., a finite inductor):

$$\frac{x^2}{\left(z + \frac{1}{j\omega L}\right)} = c_4 \tag{8}$$

$$\frac{xy}{\left(z + \frac{1}{j\omega L}\right)} = c_5 \tag{9}$$

$$\frac{y^2}{\left(z + \frac{1}{j\omega L}\right)} = c_6 \tag{10}$$

In some embodiments, calculation component 110 can divide equation (5) above by equation (8) above to derive equation (11) below.

$$\frac{\left(z + \frac{1}{j\omega L}\right)}{z} = c_1/c_4 \tag{11}$$

In some embodiments, based on such division of equation (5) by equation (8), calculation component 110 can further solve equation (11) for z to obtain $z=Y_{J1}$, where z can represent the internal diagonal element $Y_{J1}$ of equation (2) above.

In some embodiments, qubit port measurement system 102 can determine off-diagonal elements $Y_{1,J1}=Y_{J1,1}$ and $Y_{2,J1}=Y_{J1,2}$ (of equation (2) above). For example, based on solving equation (11) above for z to obtain $z=Y_{J1}$, qubit port measurement system 102 can employ calculation component 110 to solve equations (5), (6), and (7) to obtain $x=Y_{1,J1}=Y_{J1,1}$ and $y=Y_{2,J1}=Y_{J1,2}$. In this example, solving for x and y, can constitute computation of elements that connect qubit ports $J_1$ and $J_2$ to external ports 1 and 2. In some embodiments, qubit port measurement system 102 can employ calculation component 110 to utilize the non-limiting example process described here to solve for $Y_{1,J2}$ and $Y_{2,J2}$.

In some embodiments, qubit port measurement system 102 and/or calculation component 110 can determine x and y (as described above) to a phase of $\pm\pi$ due to applying a boundary condition on a qubit port without defining the polarity of such qubit port. In such embodiments, solutions with different phases can correspond to two possible choices for the polarity, which can be descriptions of the same physical system. In some embodiments, qubit port measurement system 102 can solve sign ambiguities by employing termination component 108 to shunt a qubit port (e.g., qubit ports $J_1$ and/or $J_2$ of qubit ports 118a, 118b, 118n) with a diode. In such embodiments, the sign corresponding to a relevant block can be determined from one low-frequency measurement.

In some embodiments, qubit port measurement system 102 can determine off-diagonal element $Y_{J1,J2}$ (of equation (2) above) between qubit ports $J_1$ and $J_2$. In some embodiments, to facilitate determining off-diagonal element $Y_{J1,J2}$ qubit port measurement system 102 can employ termination component 108 to terminate qubit ports $J_1$ and $J_2$ with open circuit electrical connections such that: $I_{J1}=I_{J2}=0$. In some embodiments, based on such termination of qubit ports $J_1$ and $J_2$ (with open circuits), qubit port measurement system 102 can further employ calculation component 110 to solve the $3^{rd}$ and $4^{th}$ lines of equation (2) above for $V_{J1}$ and $V_{J2}$ to obtain the following equations (12), (13), (14), and (15):

$$\begin{pmatrix} V_{J_1} \\ V_{J_2} \end{pmatrix} = -Y_J^{-1} Y_{JX} \begin{pmatrix} V_1 \\ V_2 \end{pmatrix} \tag{12}$$

where $$Y_J = \begin{pmatrix} Y_{J_1} & Y_{J_1,J_2} \\ Y_{J_2,J_1} & Y_{J_2} \end{pmatrix} \tag{13}$$

$$= \begin{pmatrix} Y_{J_1} & x \\ x & Y_{J_2} \end{pmatrix} \tag{14}$$

and $$Y_{JX} = \begin{pmatrix} Y_{J_1,1} & Y_{J_1,2} \\ Y_{J_2,1} & Y_{J_2,2} \end{pmatrix} \tag{15}$$

In some embodiments, equation (12) can be employed by qubit port measurement system 102 and/or calculation component 110 to determine voltage across qubit ports $J_1$ and $J_2$. In some embodiments, based on obtaining equation (12) above, qubit port measurement system 102 can further employ calculation component 110 to plug equation (12) into the $1^{st}$ and $2^{nd}$ lines of equation (2) to obtain equation (16) below, where $Y_{XJ}=Y_{JX}^T$.

$$Y_X - Y_{XJ} Y_J^{-1} Y_{JX} \tag{6}$$

In some embodiments, equation (16), can represent measurements taken by qubit port measurement system 102 at external ports 1 and 2 based on such termination of qubit ports $J_1$ and $J_2$ (with open circuits) as described above. In some embodiments, qubit port measurement system 102 can further employ calculation component 110 to derive the following quadratic equation for x from the 1–1 entry for some complex number c, where x can be the off-diagonal element of equation (2) that can represent the relationship (e.g., a linear relationship) between qubit ports $J_1$ and $J_2$:

$$Y_{11} + \frac{2xY_{1,J_1}Y_{1,J_2} + Y_{J_1}Y_{1,J_2}^2 + Y_{J_2}Y_{1,J_1}^2}{Y_{J_1}Y_{J_2} - x^2} = c$$

In some embodiments, qubit port measurement system 102 can employ calculation component 110 to solve the above quadratic equation for $x=Y_{J1,J2}$, as all other parameters can be determined by qubit port measurement system 102 and/or calculation component 110 (e.g., as described above with reference to equations (1) to (16)).

In some embodiments, a total number of measurements (e.g., measurements at external ports 120a, 120b, 120n) required to enable qubit port measurement system 102 and/or calculation component 110 to solve equations (1) to (16) for all unknown parameters (e.g., to determine a complete admittance matrix of equation (2) as described above) can be determined by the following equation, where $N_J$ is a total number of junctions of respective qubits (e.g., number of qubit ports 118a, 118b, 118n of respective qubits 116a, 116b, 116n):

$$1 + 2N_J + \binom{N_J}{2}$$

Figure 2:
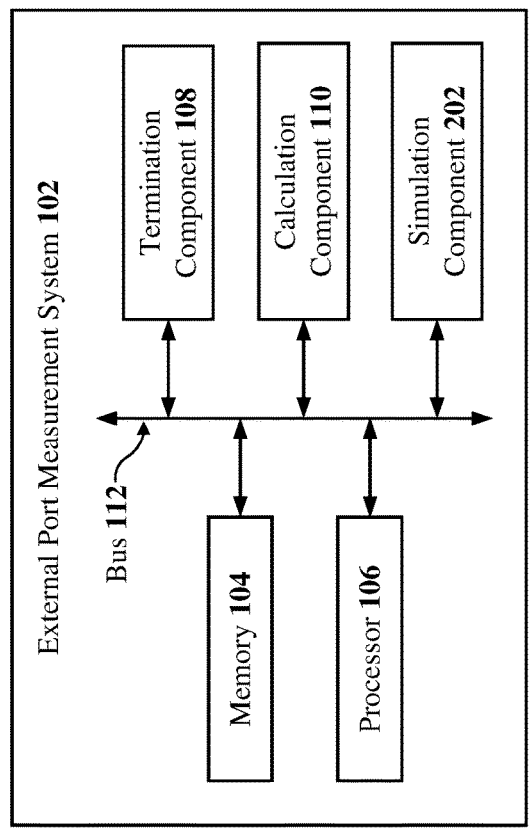
FIG. 2 illustrates a block diagram of an example, non-limiting system that facilitates external port measurement of qubit port response components in accordance with one or more embodiments described herein.

FIG. 2 illustrates a block diagram of an example, non-limiting system 200 that facilitates external port measurement of qubit port response components in accordance with one or more embodiments described herein. Repetitive description of like elements employed in respective embodiments is omitted for sake of brevity. According to several embodiments, system 200 can comprise qubit port measurement system 102. In some embodiments, qubit port measurement system 102 can comprise a simulation component 202.

In some embodiments, qubit port measurement system 102 can be implemented in a physical (real) world environment. For example, qubit port measurement system 102 can be implemented experimentally in a physical (real) world environment. For instance, system 100 described above with reference to FIG. 1 can represent an implementation of qubit port measurement system 102 in a physical (real) world environment.

Additionally or alternatively, in some embodiments, qubit port measurement system 102 can be implemented in a simulated (virtual) environment. According to multiple embodiments, simulation component 202 can facilitate simulation of a circuit-QED system in a simulated (virtual) environment. For example, simulation component 202 can facilitate simulation of one or more components of system 100 described above with refence to FIG. 1. For instance, simulation component 202 can facilitate simulation of system 100 components including, but not limited to, qubit port measurement system 102, termination component 108, calculation component 110, superconducting chip 114, qubits 116a, 116b, 116n, qubit ports 118a, 118b, 118n, external ports 120a, 120b, 120n, external electronic device 122, linear passive microwave structure 124, and/or another system 100 component.

In some embodiments, qubit port measurement system 102, termination component 108, and/or calculation component 110 can employ simulation component 202 to execute one or more respective operations of such components. For example, qubit port measurement system 102, termination component 108, and/or calculation component 110 can employ simulation component 202 to execute one or more respective operations of such components described above with reference to FIG. 1.

Figure 3:
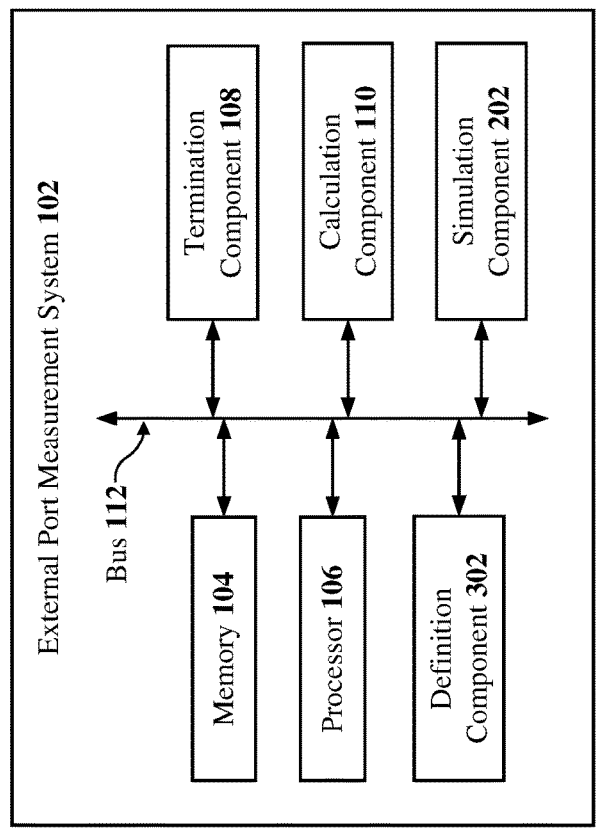
FIG. 3 illustrates a block diagram of an example, non-limiting system that facilitates external port measurement of qubit port response components in accordance with one or more embodiments described herein.

FIG. 3 illustrates a block diagram of an example, non-limiting system 300 that facilitates external port measurement of qubit port response components in accordance with one or more embodiments described herein. Repetitive description of like elements employed in respective embodiments is omitted for sake of brevity. According to several embodiments, system 300 can comprise qubit port measurement system 102. In some embodiments, qubit port measurement system 102 can comprise a definition component 302.

According to multiple embodiments, definition component 302 can define one or more components of a circuit-QED system implemented in a simulated environment. For example, definition component 302 can define one or more components of system 100 implemented in a simulated environment. For instance, definition component 302 can define one or more components of system 100 implemented in a simulated environment via simulation component 202 as described above with reference to FIG. 2. In some embodiments, simulation component 202 can comprise definition component 302.

In some embodiments, definition component 302 can define components of system 100 including, but not limited to: superconducting chip 114 (e.g., superconducting qubit circuits of superconducting chip 114); qubits 116a, 116b, 116n (e.g., type of qubits such as, for instance, transmon qubit, charge qubit, flux qubit, phase qubit, etc.); qubit ports 118a, 118b, 118n (e.g., quantity of ports per qubit, location of Josephson junction terminals, voltage applied across such terminals, current flowing into qubit, etc.); external ports 120a, 120b, 120n (e.g., quantity of external ports, location of external ports on cross-section of linear passive microwave structure 124, etc.), external electronic device 122 (e.g., type of device such as, for example, a VNA), linear passive microwave structure 124 (e.g., type of structure such as, for example, a coaxial line (e.g., a 50 Ohm line), a transmission line, a bus (e.g., a resonant bus), a waveguide, a microwave resonator, etc.), and/or another system 100 component.

In some embodiments, qubit port measurement system 102 can be an external port measurement of qubit port response system and/or process associated with various technologies. For example, qubit port measurement system 102 can be associated with superconducting quantum circuit technologies, quantum bit (qubit) technologies, circuit quantum electrodynamics (circuit-QED) technologies, quantum computing technologies, scalable quantum computing architecture technologies, surface code architecture technologies, surface code error correction architecture technologies, quantum hardware technologies, and/or other technologies.

In some embodiments, qubit port measurement system 102 can provide technical improvements to systems, devices, components, operational steps, and/or processing steps associated with the various technologies identified above. For example, qubit port measurement system 102 can facilitate determining qubit port responses of one or more qubits of a superconducting quantum circuit using external ports of a quantum system (e.g., a circuit-QED) rather than accessing the qubit port directly to determine such qubit port responses.

In some embodiments, qubit port measurement system 102 can provide technical improvements to a processing unit associated with a quantum computing device (e.g., a quantum processor, quantum hardware etc.), a circuit-QED system and/or a superconducting quantum circuit. For example, an advantage of qubit port measurement system 102 is that it can probe qubits of a quantum computing device (e.g., a quantum processor) by accessing external ports of a such quantum computing device rather than directly accessing qubit ports of such qubits that are internal to such quantum computing device. In some embodiments, by facilitating such external probing of qubits internal to such a quantum computing device (e.g., a quantum processor), qubit port measurement system 102 can eliminate the need to design and/or manufacture such a quantum computing device with physical qubit ports on the qubits that can be accessed to probe the qubits. In such embodiments, an advantage of qubit port measurement system 102 is that it can facilitate improved design, manufacturing, functionality, integrity, and/or performance of such a quantum computing device (e.g., a quantum processor) by eliminating the need for such accessible physical qubit ports on the qubits of such a quantum computing device.

Additionally or alternatively, in some embodiments, another advantage of qubit port measurement system 102 is that it can determine a multiport admittance function corresponding to multiple qubit ports of multiple qubits internal to a quantum computing device (e.g., a quantum processor). In such embodiments, qubit port measurement system 102 can eliminate the need for such a quantum computing device to process individual admittance functions corresponding to individual qubit ports. In these embodiments, by eliminating the need for such a quantum computing device to process individual admittance functions corresponding to individual qubit ports, qubit port measurement system 102 can thereby facilitate improved processing efficiency, and therefore, improved processing capacity and/or improved processing performance of such a quantum computing device (e.g., a quantum processor).

In some embodiments, another advantage of qubit port measurement system 102 is that it can determine a multiport admittance function corresponding to an indefinite quantity of qubit ports of an indefinite quantity of qubits internal to a quantum computing device (e.g., a quantum processor). In such embodiments, qubit port measurement system 102 can enable scalability of a qubit probing system that can be employed to externally probe such indefinite quantity of qubits internal to such quantum computing device.

In some embodiments, qubit port measurement system 102 can employ hardware and/or software to solve problems that are highly technical in nature, that are not abstract and that cannot be performed as a set of mental acts by a human. For example, qubit port measurement system 102 can automatically: terminate one or more qubit ports using different electrical connections; and determine one or more qubit port responses from external port responses based on the terminating. In such an example, qubit port measurement system 102 can process microwave frequency signals and employ various complex mathematical functions and/or algorithms (e.g., matrix equations (2) to (16) described above with reference to calculation component 110 and FIG. 1) comprising a multitude of variables, where such mathematical functions are implemented in a d-dimensional vector space to facilitate execution of the various operations of qubit port measurement system 102 as described herein.

It is to be appreciated that qubit port measurement system 102 can perform an external port measurement of qubit port response process utilizing various combinations of electrical components, mechanical components, and circuitry that cannot be replicated in the mind of a human or performed by a human. For example, terminating qubit ports using various electrical connections, measuring microwave frequency signals, determining external port responses, and/or determining qubit port responses, are operations that are greater than the capability of a human mind. For instance, the amount of data processed, the speed of processing such data, and/or the types of data processed by qubit port measurement system 102 over a certain period of time can be greater, faster, and/or different than the amount, speed, and/or data type that can be processed by a human mind over the same period of time.

According to several embodiments, qubit port measurement system 102 can also be fully operational towards performing one or more other functions (e.g., fully powered on, fully executed, etc.) while also performing the above-referenced external port measurement of qubit port response process. It should be appreciated that such simultaneous multi-operational execution is beyond the capability of a human mind. It should also be appreciated that qubit port measurement system 102 can include information that is impossible to obtain manually by an entity, such as a human user. For example, the type, amount, and/or variety of information included in termination component 108, calculation component 110, superconducting chip 114, qubits 116a, 116b, 116n, qubit ports 118a, 118b, 118n, external ports 120a, 120b, 120n, simulation component 202, and/or definition component 302 can be more complex than information obtained manually by a human user.

Figure 4:
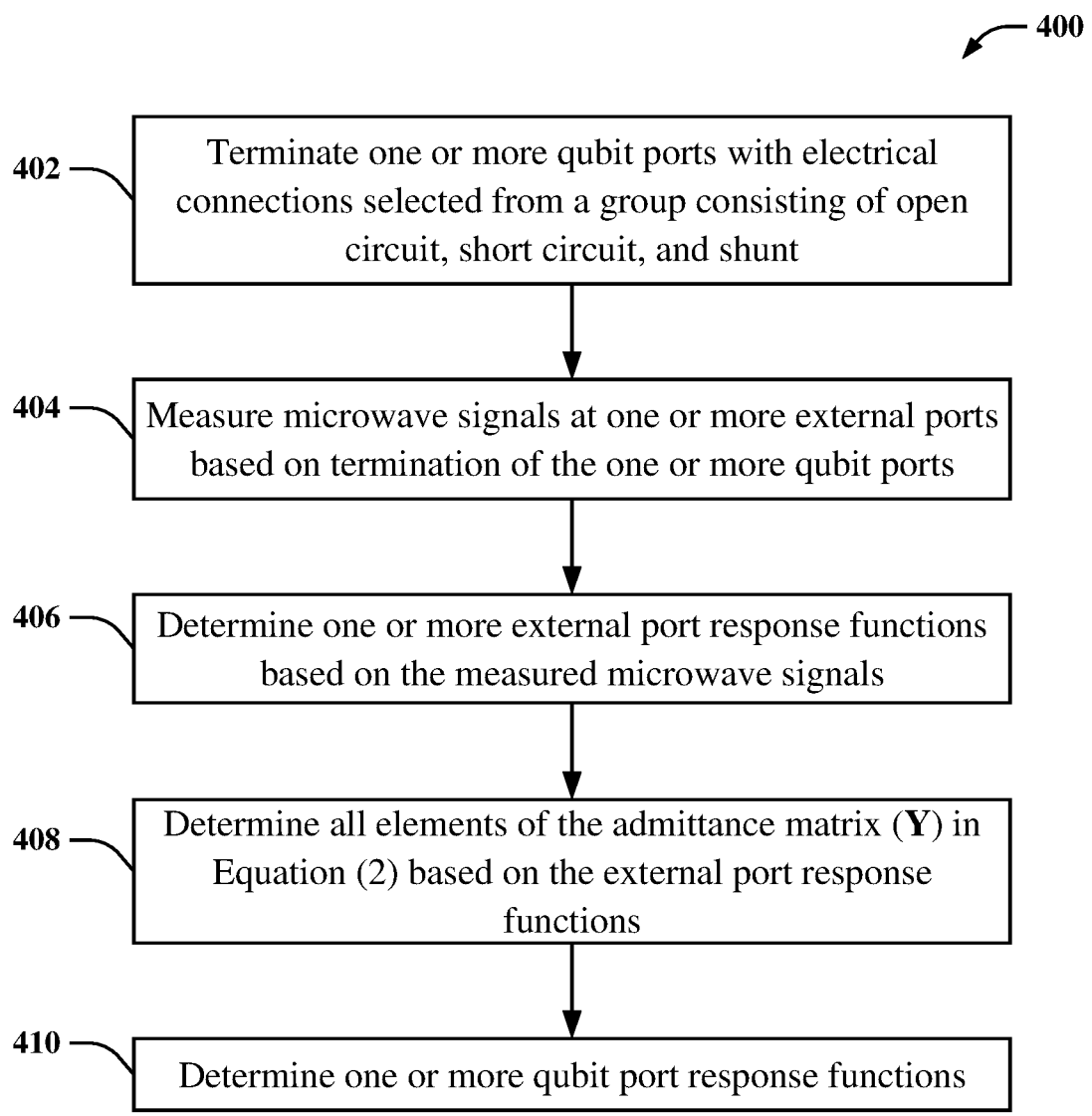
FIG. 4 illustrates a flow diagram of an example, non-limiting computer-implemented method that facilitates external port measurement of qubit port response components in accordance with one or more embodiments described herein.

FIG. 4 illustrates a flow diagram of an example, non-limiting computer-implemented method 400 that facilitates external port measurement of qubit port response components in accordance with one or more embodiments described herein. Repetitive description of like elements employed in respective embodiments is omitted for sake of brevity.

At 402, qubit port measurement system 102 can terminate (e.g., via termination component 108) one or more qubit ports (e.g., qubit ports 118a, 118b, 118n) with electrical connections selected from a group consisting of open circuit, short circuit, and shunt (e.g., or combinations thereof).

At 404 qubit port measurement system 102 can measure (e.g., via linear passive microwave structure 124) microwave signals at one or more external ports (e.g., external ports 120a, 120b, 120n) based on termination of the one or more qubit ports.

At 406, qubit port measurement system 102 can determine (e.g., via termination component 108 and/or calculation component 110, as described above with reference to FIG. 1) one or more external port response functions (e.g., admittance functions, multiport admittance functions, impedance functions, etc.) based on the measured microwave signals.

At 408, qubit port measurement system 102 can determine (e.g., via termination component 108 and/or calculation component 110, as described above with reference to FIG. 1) all elements of the admittance matrix (Y) in equation (2). For example, at 408, qubit port measurement system 102 can employ termination component 108, calculation component 110, and/or equations (1) to (16) as described above with reference to FIG. 1 to solve for all elements of the admittance matrix (Y) in equation (2).

At 410, qubit port measurement system 102 can determine (e.g., via calculation component 110) one or more qubit port response functions (e.g., admittance functions, multiport admittance functions, impedance functions, etc.). For example, based on the one or more external port response functions and/or the elements of the admittance matrix (Y) determined at 406 and 408, respectively, qubit port measurement system 102 can facilitate determining such one or more qubit port response functions at 410.

Figure 5:
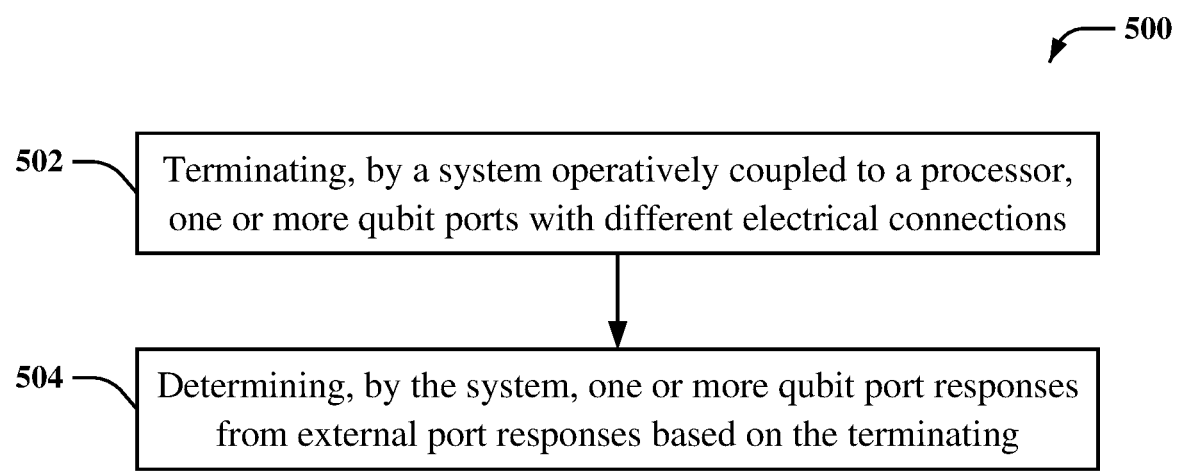
FIG. 5 illustrates a flow diagram of an example, non-limiting computer-implemented method that facilitates external port measurement of qubit port response components in accordance with one or more embodiments described herein.

FIG. 5 illustrates a flow diagram of an example, non-limiting computer-implemented method 500 that facilitates external port measurement of qubit port response components in accordance with one or more embodiments described herein. Repetitive description of like elements employed in respective embodiments is omitted for sake of brevity.

At 502, terminating, by a system (e.g., via qubit port measurement system 102 and/or termination component 108) operatively coupled to a processor (e.g., processor 106), one or more qubit ports (e.g., qubit ports 118a, 118b, 118n) with different electrical connections (e.g., via an open circuit electrical connection, a short circuit electrical connection, a shunt, etc.).

At 504, determining, by the system (e.g., via qubit port measurement system 102, termination component 108, and/or calculation component 110), one or more qubit port responses (e.g., microwave response functions such as, for example, admittance matrices, multiport admittance functions, impedance matrices, etc.) from external port responses (e.g., external port microwave response functions such as, for example, external admittance matrices, external impedance matrices, etc.) based on the terminating. In some embodiments, the system (e.g., qubit port measurement system 102) can determine such external port responses of operation 504 by accessing one or more external ports 120a, 120b, 120n (e.g., via linear passive microwave structure 124) to measure microwave signals at such external port(s).

Figure 6:
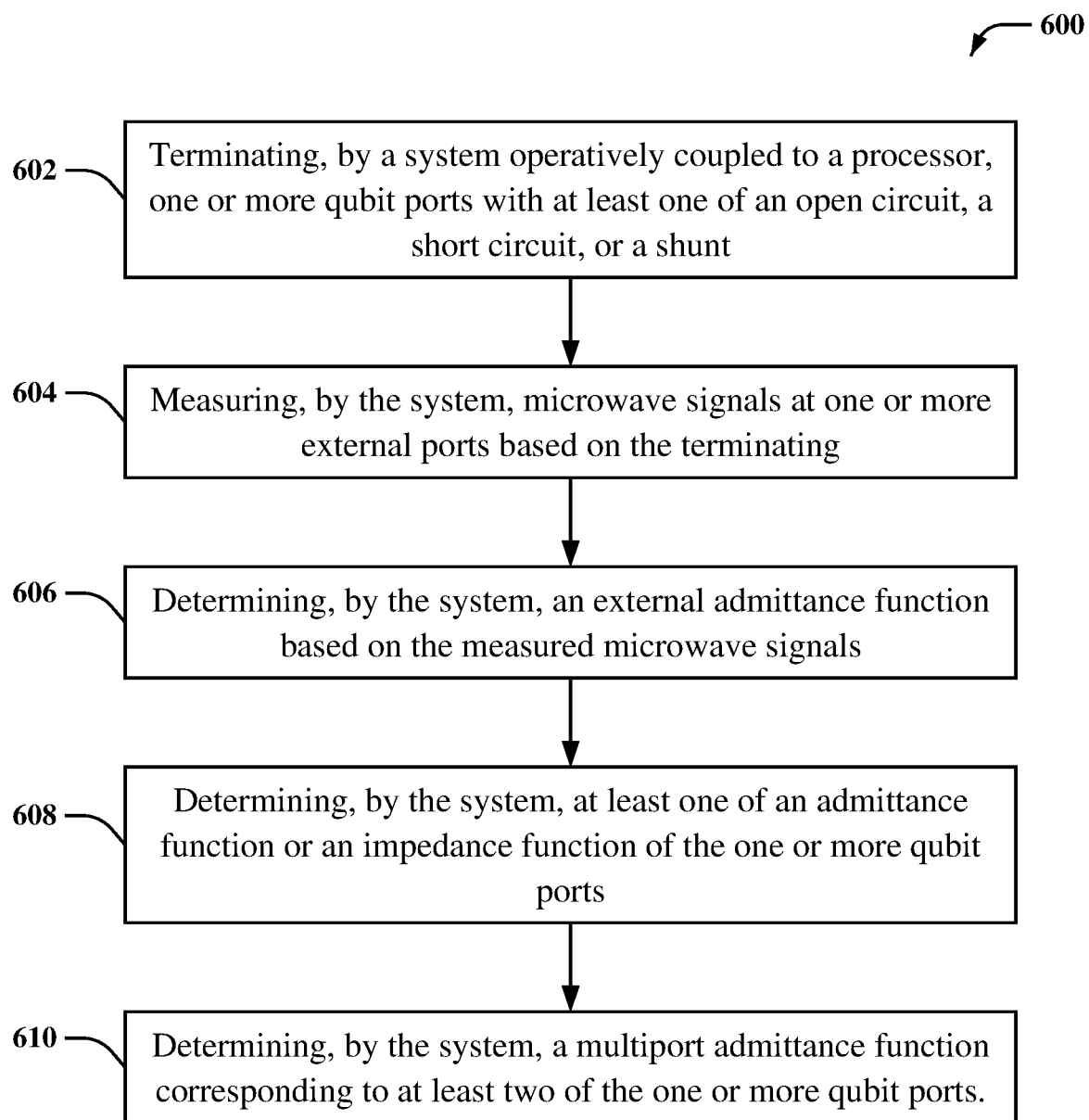
FIG. 6 illustrates a flow diagram of an example, non-limiting computer-implemented method that facilitates external port measurement of qubit port response components in accordance with one or more embodiments described herein.

FIG. 6 illustrates a flow diagram of an example, non-limiting computer-implemented method 600 that facilitates external port measurement of qubit port response components in accordance with one or more embodiments described herein. Repetitive description of like elements employed in respective embodiments is omitted for sake of brevity.

At 602, terminating, by a system (e.g., via qubit port measurement system 102 and/or termination component 108) operatively coupled to a processor (e.g., processor 106), one or more qubit ports (e.g., qubit ports 118a, 118b, 118n) with at least one of an open circuit, a short circuit, or a shunt (e.g., as described above with reference to qubit port measurement system 102, termination component 108, and FIG. 1).

At 604, measuring, by the system (e.g., qubit port measurement system 102 and/or linear passive microwave structure 124), microwave signals (e.g., microwave frequency signals reflected by qubits 116a, 116b, 116n) at one or more external ports (e.g., external ports 120a, 120b, 120n) based on the terminating.

At 606, determining, by the system (e.g., qubit port measurement system 102, termination component 108, and/or calculation component 110), an external admittance function (e.g., an external admittance function corresponding respectively to one or more external ports 120a, 120b, 120n) based on the measured microwave signals.

At 608, determining, by the system (e.g., qubit port measurement system 102, termination component 108, and/or calculation component 110), at least one of an admittance function or an impedance function of the one or more qubit ports (e.g., as described above with reference to qubit port measurement system 102, termination component 108 calculation component 110, and FIG. 1).

At 610, determining, by the system (e.g., qubit port measurement system 102, termination component 108, and/or calculation component 110), a multiport admittance function corresponding to at least two of the one or more qubit ports (e.g., via performing the operations of qubit port measurement system 102, termination component 108, and/or calculation component 110 described in FIG. 1 using at least two or more qubit ports).

Figure 7:
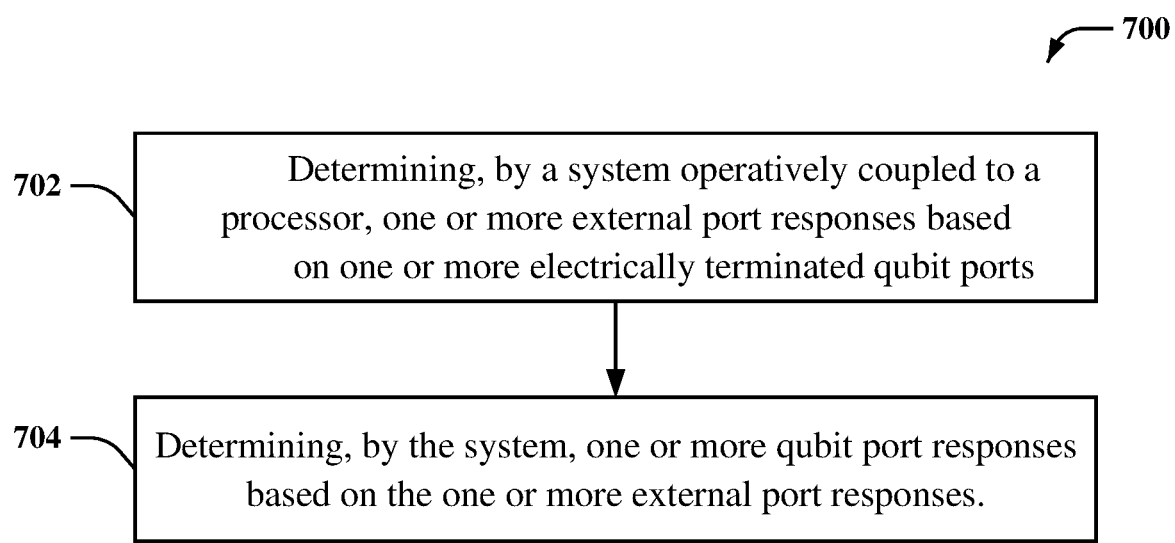
FIG. 7 illustrates a flow diagram of an example, non-limiting computer-implemented method that facilitates external port measurement of qubit port response components in accordance with one or more embodiments described herein.

FIG. 7 illustrates a flow diagram of an example, non-limiting computer-implemented method 700 that facilitates external port measurement of qubit port response components in accordance with one or more embodiments described herein. Repetitive description of like elements employed in respective embodiments is omitted for sake of brevity.

At 702, determining, by the system (e.g., via qubit port measurement system 102, termination component 108, and/or calculation component 110) operatively coupled to a processor (e.g., processor 106), one or more external port responses (e.g., external port responses of external ports 120a, 120b, 120n such as, for example, admittance functions, impedance functions, etc.) based on one or more electrically terminated qubit ports (e.g., one or more qubit ports 118a, 118b, 118n electrically terminated using an open circuit(s), a short circuit(s), and/or a shunt(s) or combinations thereof).

At 704, determining, by the system (e.g., via qubit port measurement system 102, termination component 108, and/or calculation component 110), one or more qubit port responses (e.g., qubit port responses of qubit ports 118a, 118b, 118n such as, for example, admittance functions, multiport admittance functions, impedance functions, etc.) based on the one or more external port responses.

Figure 8:
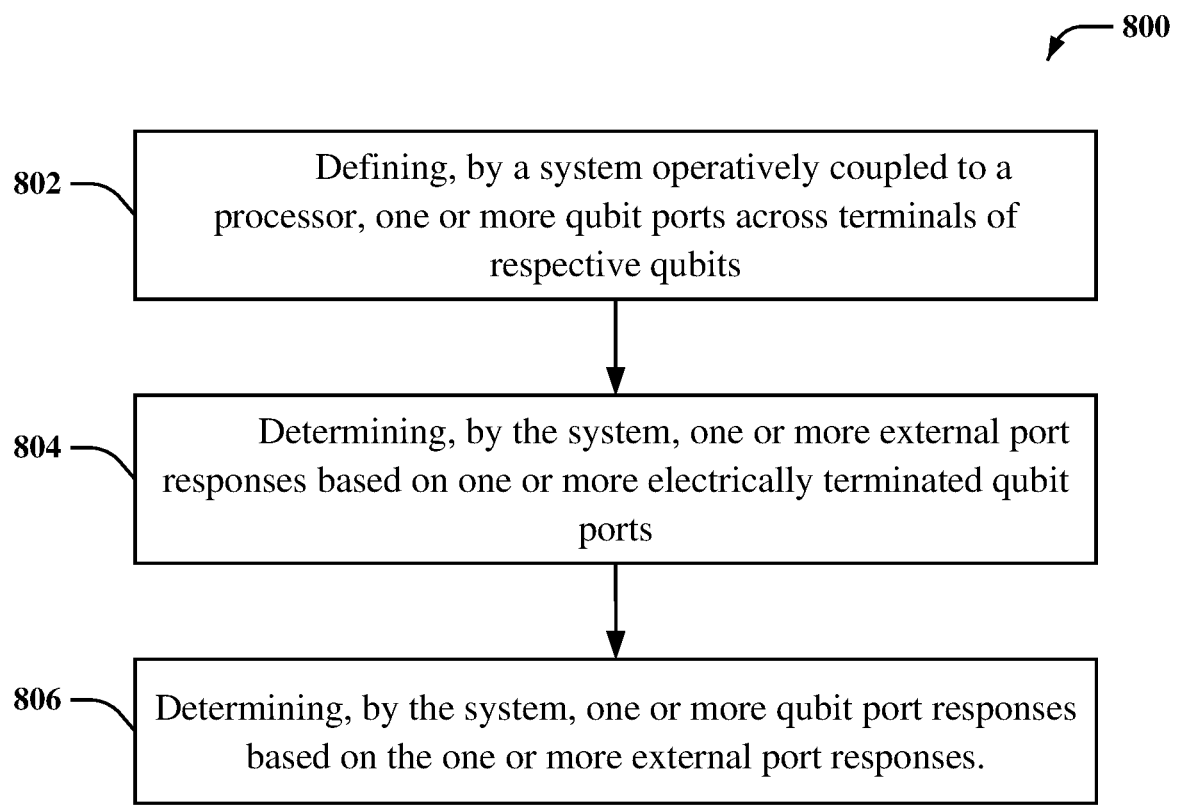
FIG. 8 illustrates a flow diagram of an example, non-limiting computer-implemented method that facilitates external port measurement of qubit port response components in accordance with one or more embodiments described herein.

FIG. 8 illustrates a flow diagram of an example, non-limiting computer-implemented method 800 that facilitates external port measurement of qubit port response components in accordance with one or more embodiments described herein. Repetitive description of like elements employed in respective embodiments is omitted for sake of brevity.

At 802, defining, by a system (e.g., qubit port measurement system 102, simulation component 202, and/or definition component 302) operatively coupled to a processor (e.g., processor 106), one or more qubit ports (e.g., qubit ports 118a, 118b, 118n) across terminals (e.g., Josephson junction terminals) of respective qubits (e.g., qubits 116a, 116b, 116n).

At 804, determining, by the system (e.g., via qubit port measurement system 102, termination component 108, and/or calculation component 110), one or more external port responses (e.g., external port responses of external ports 120a, 120b, 120n such as, for example, admittance functions, impedance functions, etc.) based on one or more electrically terminated qubit ports (e.g., one or more qubit ports 118a, 118b, 118n electrically terminated using an open circuit(s), a short circuit(s), and/or a shunt(s) or combinations thereof).

At 806, determining, by the system (e.g., via qubit port measurement system 102, termination component 108, and/or calculation component 110), one or more qubit port responses (e.g., qubit port responses of qubit ports 118a, 118b, 118n such as, for example, admittance functions, multiport admittance functions, impedance functions, etc.) based on the one or more external port responses.

Figure 9:
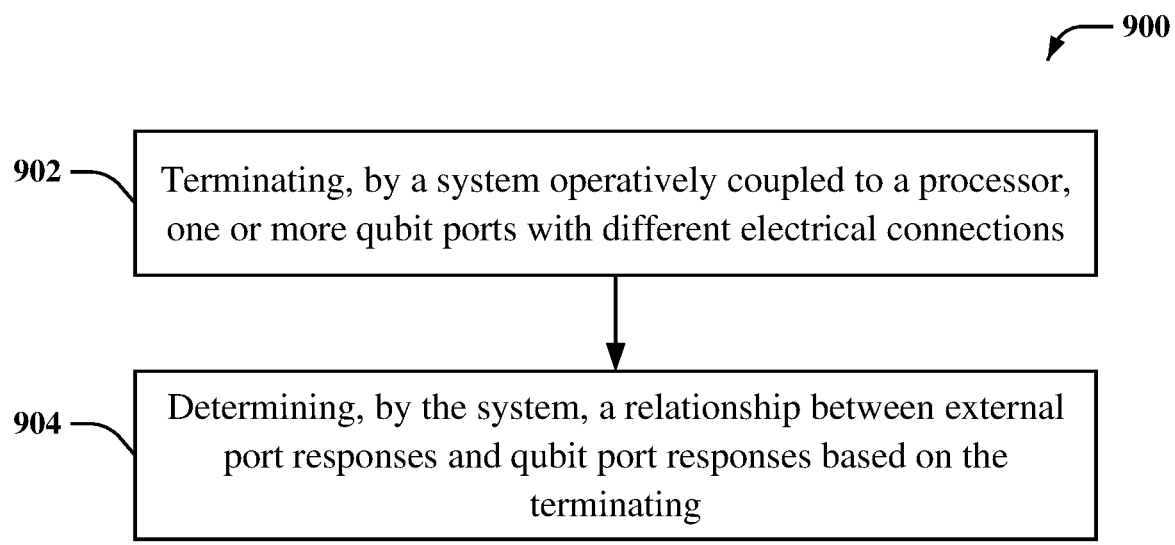
FIG. 9 illustrates a flow diagram of an example, non-limiting computer-implemented method that facilitates external port measurement of qubit port response components in accordance with one or more embodiments described herein.

FIG. 9 illustrates a flow diagram of an example, non-limiting computer-implemented method 900 that facilitates external port measurement of qubit port response components in accordance with one or more embodiments described herein. Repetitive description of like elements employed in respective embodiments is omitted for sake of brevity.

At 902, terminating, by a system (e.g., qubit port measurement system 102 and/or termination component 108) operatively coupled to a processor (e.g., processor 106), one or more qubit ports (e.g., qubit ports 118a, 118b, 118n) with different electrical connections (e.g., via an open circuit electrical connection, a short circuit electrical connection, a shunt, etc.).

At 904, determining, by the system (e.g., qubit port measurement system 102 and/or calculation component 110), a relationship (e.g., a linear relationship as described above with reference to FIG. 1) between external port responses (e.g., external port responses of external ports 120a, 120b, 120n such as, for example, admittance functions, impedance functions, etc.) and qubit port responses (e.g., qubit port responses of qubit ports 118a, 118b, 118n such as, for example, admittance functions, multiport admittance functions, impedance functions, etc.) based on the terminating.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
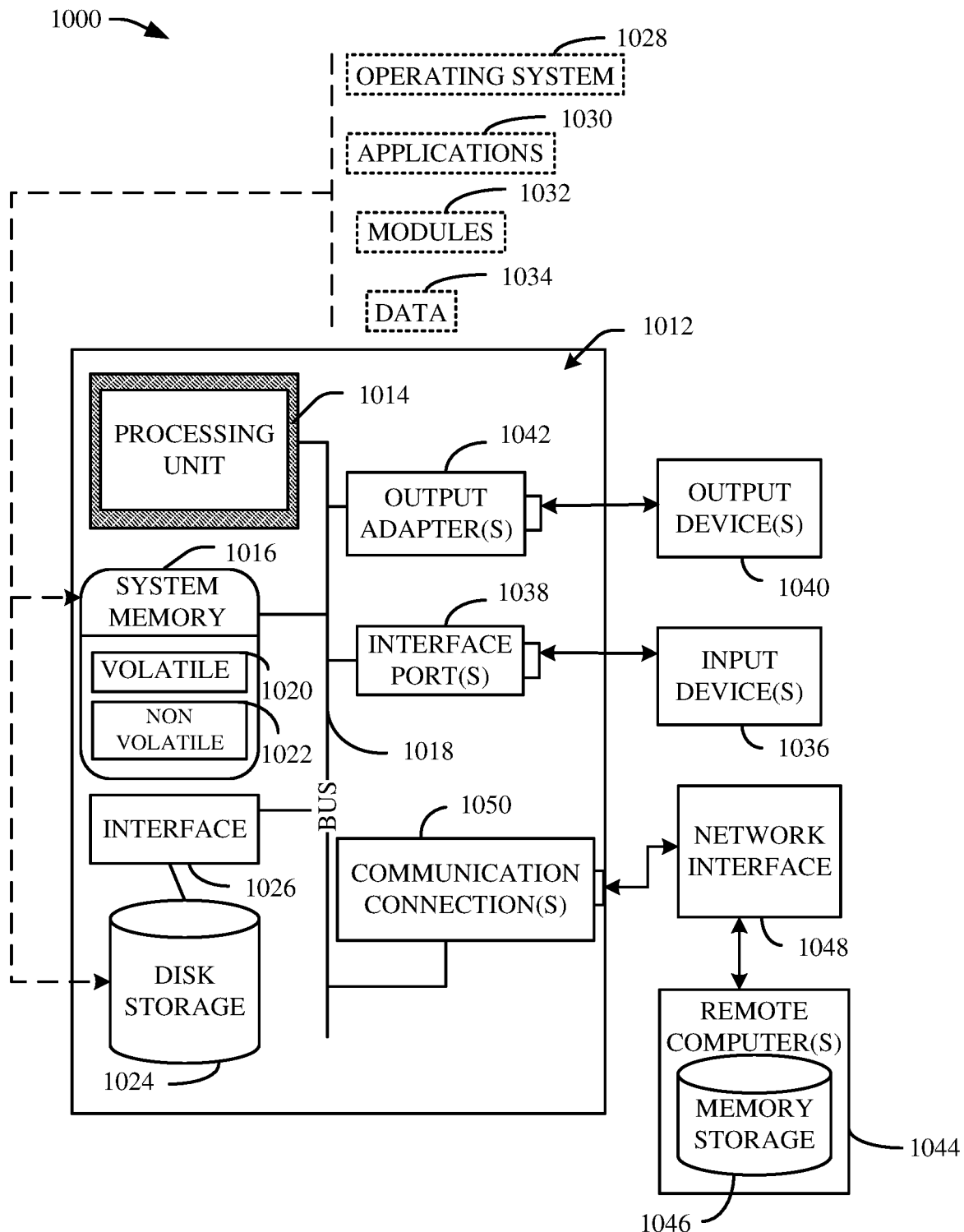
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
   terminating, by a system operatively coupled to a processor, one or more qubit ports with different electrical connections; and
   determining, by the system, one or more qubit port responses from external port responses based on the terminating, wherein the terminating comprises terminating, by the system, at least one of the one or more qubit ports with a shunt selected from a group consisting of an inductor, a finite inductor, a finite linear inductor, a diode, and an electrical resistor.

2. The computer-implemented method of claim 1, wherein the terminating comprises terminating, by the system, the one or more qubit ports with at least one of an open circuit, a short circuit, or the shunt.

3. The computer-implemented method of claim 1, wherein the terminating comprises:
   terminating, by the system, a first qubit port with an open circuit; and
   terminating, by the system, a second qubit port with a short circuit.

4. The computer-implemented method of claim 1, wherein the terminating comprises:
   terminating, by the system, a first qubit port with the shunt; and
   terminating, by the system, a second qubit port with a short circuit.

5. The computer-implemented method of claim 1, further comprising determining, by the system, a multiport admittance function corresponding to at least two of the one or more qubit ports.

6. The computer-implemented method of claim 1, further comprising determining, by the system, an external admittance function based on the external port responses.

7. The computer-implemented method of claim 1, further comprising determining, by the system, at least one of an admittance function or an impedance function of the one or more qubit ports.

8. A system, comprising:
   a memory that stores computer executable components; and
   a processor that executes the computer executable components stored in the memory, wherein the computer executable components comprise:
      a termination component that terminates one or more qubit ports with different electrical connections; and
      a calculation component that determines one or more qubit port responses from external port responses based on one or more terminated qubit ports, wherein the termination component terminates at least one of the one or more terminated qubit ports with a shunt selected from a group consisting of an inductor, a finite inductor, a finite linear inductor, a diode, and an electrical resistor.

9. The system of claim 8, wherein the termination component terminates the one or more qubit ports with at least one of an open circuit, a short circuit, or the shunt.

10. The system of claim 8, wherein the termination component terminates a first qubit port with at least one of an open circuit or the shunt and a second qubit port with a short circuit.

11. The system of claim 8, wherein the calculation component determines at least one of an admittance function or an impedance function of the one or more qubit ports.

12. The system of claim 8, wherein the calculation component determines an external admittance function based on the external port responses.

13. A computer-implemented method, comprising:
   determining, by a system operatively coupled to a processor, one or more external port responses based on one or more electrically terminated qubit ports; and
   determining, by the system, one or more qubit port responses based on the one or more external port responses, wherein the one or more electrically terminated qubit ports are terminated with a shunt selected from a group consisting of an inductor, a finite inductor, a finite linear inductor, a diode, and an electrical resistor.

14. The computer-implemented method of claim 13, further comprising defining, by the system, one or more qubit ports across terminals of respective qubits.

15. The computer-implemented method of claim 13, further comprising terminating, by the system, one or more qubit ports with different electrical connections selected from a group consisting of an open circuit, a short circuit, and the shunt.

16. The computer-implemented method of claim 13, further comprising:
   terminating, by the system, a first qubit port with at least one of an open circuit or the shunt; and
   terminating, by the system, a second qubit port with a short circuit.

17. The computer-implemented method of claim 13, further comprising determining, by the system, a multiport admittance function corresponding to at least two qubit ports.

18. A non-transitory computer program product facilitating an external port measurement of qubit port responses process, the computer program product comprising a computer readable storage medium having program instructions embodied therewith, the program instructions executable by a processor to cause the processor to:
   determine, by the processor, one or more external port responses based on one or more electrically terminated qubit ports;
   determine, by the processor, one or more qubit port responses based on the one or more external port responses, wherein the one or more electrically terminated qubit ports are terminated with a shunt selected from a group consisting of an inductor, a finite inductor, a finite linear inductor, a diode, and an electrical resistor.

19. The non-transitory computer program product of claim 18, wherein the program instructions are further executable by the processor to cause the processor to define, by the processor, one or more qubit ports across terminals of respective qubits.

20. The non-transitory computer program product of claim 18, wherein the program instructions are further executable by the processor to cause the processor to terminate, by the processor, one or more qubit ports with different electrical connections selected from a group consisting of an open circuit, a short circuit, and the shunt.

21. The non-transitory computer program product of claim 18, wherein the program instructions are further executable by the processor to cause the processor to determine, by the processor, a multiport admittance function corresponding to at least two qubit ports.

22. A computer-implemented method, comprising:
 terminating, by a system operatively coupled to a processor, one or more qubit ports with different electrical connections; and
 determining, by the system, a relationship between external port responses and qubit port responses based on the terminating, wherein the terminating is with a shunt selected from a group consisting of an inductor, a finite inductor, a finite linear inductor, a diode, and an electrical resistor.

23. The computer-implemented method of claim 22, further comprising determining, by the system, the external port responses at one or more external ports.

24. The computer-implemented method of claim 22, further comprising determining, by the system, a multiport admittance function corresponding to at least two of the one or more qubit ports.

* * * * *